United States Patent
Chen et al.

(10) Patent No.: US 10,061,884 B2
(45) Date of Patent: Aug. 28, 2018

(54) DUMMY PATTERN FILLING METHOD

(71) Applicant: SHANGHAI HUAHONG GRACE SEMICONDUCTOR MANUFACTURING CORPORATION, Shanghai (CN)

(72) Inventors: Hualun Chen, Shanghai (CN); Weiran Kong, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 10 days.

(21) Appl. No.: 15/363,514

(22) Filed: Nov. 29, 2016

(65) Prior Publication Data

US 2017/0344687 A1 Nov. 30, 2017

(30) Foreign Application Priority Data

May 31, 2016 (CN) .......................... 2016 1 0373502

(51) Int. Cl.
*G06F 17/50* (2006.01)
*H01L 27/02* (2006.01)

(52) U.S. Cl.
CPC ...... *G06F 17/5072* (2013.01); *G06F 17/5081* (2013.01); *H01L 27/0207* (2013.01)

(58) Field of Classification Search
CPC ............. G06F 17/5072; G06F 17/5081; H01L 27/0207
See application file for complete search history.

(56) References Cited

U.S. PATENT DOCUMENTS

| | | | | |
|---|---|---|---|---|
| 5,888,900 A * | 3/1999 | Mizuno | ............ | H01L 21/31053 257/E21.244 |
| 6,187,688 B1 * | 2/2001 | Ohkuni | .................. | G03F 7/091 216/67 |
| 6,492,068 B1 * | 12/2002 | Suzuki | ............. | H01L 21/31138 257/E21.256 |
| 6,563,148 B2 * | 5/2003 | Kawashima | ...... | H01L 21/31053 257/202 |
| 6,583,027 B2 * | 6/2003 | Ota | ................... | H01L 21/76229 257/E21.548 |
| 6,664,642 B2 * | 12/2003 | Koubuchi | ............. | G03F 9/7076 257/758 |
| 6,743,723 B2 * | 6/2004 | Fukumoto | ......... | G02F 1/133553 134/1.1 |
| 6,795,952 B1 * | 9/2004 | Stine | ....................... | H01L 22/20 257/E21.525 |
| 7,137,092 B2 * | 11/2006 | Maeda | ................ | G06F 17/5068 716/53 |
| 7,208,350 B2 * | 4/2007 | Kawashima | ........ | G06F 17/5068 438/129 |

(Continued)

*Primary Examiner* — Naum B Levin
(74) *Attorney, Agent, or Firm* — MKG, LLC

(57) ABSTRACT

A dummy pattern filling method, including: Step I, determining the rule of filling dummy patterns, in accordance with required DR values and isolation rules of patterns; Step II, finding out blank Fields within said layout that need to be filled with dummy patterns; Step III, by following said rule of filling dummy patterns, filling dummy patterns within blank Fields on layouts. Implementing a Smart Dummy Pattern Filling, which enables the Data Ratio (DR) of dummy patterns to come infinitely close the required DR value after completing the filling of dummy patterns.

7 Claims, 2 Drawing Sheets

Step I: determining the rule of filling dummy patterns, in accordance with required DR values and separation rules

↓

Step II: Finding out blank Fields within said layout that need to be filled with dummy patterns.

↓

Step III: By following said rule of filling dummy patterns, filling dummy patterns within blank Fields on layouts.

(56) References Cited

U.S. PATENT DOCUMENTS

| | | | | |
|---|---|---|---|---|
| 7,269,807 B2* | 9/2007 | Shimada | ............ | G06F 17/5081 |
| | | | | 716/52 |
| 7,739,632 B2* | 6/2010 | Bergman Reuter | .... | G06F 17/50 |
| | | | | 716/135 |
| 7,745,239 B1* | 6/2010 | Nakagawa | .......... | G06F 17/5068 |
| | | | | 257/E21.575 |
| 7,761,833 B2* | 7/2010 | Kobayashi | ............ | H01L 23/522 |
| | | | | 716/119 |
| 7,844,934 B2* | 11/2010 | Ono | ................... | G06F 17/5072 |
| | | | | 430/30 |
| 8,122,386 B2* | 2/2012 | Kobayashi | .......... | G06F 17/5068 |
| | | | | 716/119 |
| 8,415,776 B2* | 4/2013 | Nakashiba | ............ | H01L 23/522 |
| | | | | 257/531 |
| 8,466,560 B2* | 6/2013 | Zhang | ................ | H01L 21/3212 |
| | | | | 257/773 |
| 8,490,031 B2* | 7/2013 | Izuha | ................. | G06F 17/5009 |
| | | | | 716/139 |
| 8,765,607 B2* | 7/2014 | Ruth | ................... | H01L 27/0207 |
| | | | | 438/424 |
| 9,557,637 B2* | 1/2017 | Jeon | ........................ | G03F 1/36 |
| 2005/0234684 A1* | 10/2005 | Sawicki | ............. | G06F 17/5045 |
| | | | | 703/1 |
| 2009/0319971 A1* | 12/2009 | Sakakidani | ........... | G03F 1/36 |
| | | | | 716/111 |
| 2010/0076580 A1* | 3/2010 | Kitahara | ............ | G06F 17/5068 |
| | | | | 700/97 |

\* cited by examiner

DUMMY PATTERN FILLING METHOD

CROSS REFERENCE TO RELATED APPLICATION

The present application claims priority to Chinese Patent Application No. 201610373502.8 filed on May 31, 2016, the entirety of which is incorporated by reference herein.

TECHNICAL FIELD

This invention relates to a technological process of IC fabrication and is especially relates to a dummy pattern filling method.

BACKGROUND OF INVENTION

With the development of semiconductor IC technologies and after reaching the very deep sub-micron level, the Data Ratio (DR) of the patterns on the mask, i.e., the layout seriously affects the process and fabrication of the wafer. After the technological process is fixed, especially after the etching process is determined, the change of DR will directly affects the change of dimensions and appearance of etched lines, giving rise to the performance failure of components, or even the functional failure thereof. Practical examples in Table 1 show the huge deviations of the Critical Dimension (CD) of the Active arising from the different DR of same.

TABLE 1

| Different Products | Product 1 | Product 2 | Product 3 |
|---|---|---|---|
| DR of a pattern in the active region | 28.20% | 41.05% | 42.25% |
| CD Deviation of the active region | −45 nm | −35 nm | −33 nm |

It can be seen that after the parameters of the etching process are solidified, the change of DR will cause the value of CD to change, and will affect the component performance when the CD value deviates to a relatively large extent. That is to say, the value of CD is an important parameter that influences the component performance. Therefore, it is necessary to find methods to confine the DR value to a certain range so that the components can meet relevant performance requirements.

In existing technological processes, only the Fixed Dummy Pattern Filling is adopted to fill dummy patterns so as to meet the DR requirement demanded by relevant technological processes for layers of the Active(Region), the Gate and the Metals, etc., where DRs of patterns on certain layouts need to be corrected. For example, the size of the dummy pattern for the Active is formulated in accordance with the isolation rule and other design rules for technological processes. The dummy pattern is also called the redundant pattern. FIG. 1 illustrates how fixed dummy patterns are filled. Dummy Actives (102) are filled into the empty Passive (Region), i.e., the Field (101). Both the length (d1) and breadth (d2) of the Dummy Active are 4.08 μm and the pitch between every two adjacent Dummy Actives is 2.4 μm. After all the dummy patterns are filled, the DR for partial areas is 40%. However, various kinds of isolation rules must be satisfied while filling dummy patterns. Therefore, some Fields cannot be filled with any dummy patterns. Other layers like the Gate and the Metals, etc. have the same restriction.

The Fixed Dummy Pattern Filling does correct the DR to a certain extent. However, it may not be able to close to the DR as required, or may not be able to overcome the CD deviation arising therefrom due to different layouts and different wiring for different products. Sometimes different etching menus have to be developed in accordance with different DRs with one type of etching process represented by one kind of etching menu, and etching processes need to be changed so as to overcome the CD deviation arising from the DR difference. In this way, the delivery time of products may be directly affected, and it may also give rise to difficulties in managing numerous process menus. Sometimes, it may even bring about huge losses as a result of wrong uses of menus. This problem is particularly noticeable during etching. It may be necessary to deliver different products for the same Metals layer since every approximate difference of 5% may need to correspond with a different etching process.

FIG. 2 illustrates the way fixed dummy patterns are filled under the restriction of isolation rules in accordance with the existing method. There is a Scribe Line Edge (201) on the substrate. The Active region (202) is the area marked with "ACT"; the N-well is (203); the control Gate (204) is the area marked with "GATE"; the dummy pattern is (205); the area marked with (206) is what cannot be filled by dummy patterns. Among all the above, the dummy pattern (205) has a same length and breadth; w1 represents the length or breadth of the dummy pattern (205); w2 represents the minimal pitch between the dummy pattern (205) and the Scribe Line Edge (201); w3 represents the minimal pitch between the dummy pattern (205) and the Active (202); w4 represents the minimal pitch between the dummy pattern (205) and the Gate (204); w5 represents the minimal pitch between the dummy pattern (205) within the N-well (203) and (its adjacent outer edge of) the N-well (203); W6 represents the minimal pitch between the dummy pattern (205) outside the N-well (203) and (its adjacent outer edge of) the N-well (203). Owing to the restriction of w2 and w6, no dummy pattern (205) can be filled into the area (206) since the filling thereof violates the restrictions of w2 and w6.

As shown in FIG. 2, the area (206) where no dummy pattern (205) can be filled is very large. After this area is flattened through a technological process of Chemical and Mechanical Polishing (CMP), a dishing effect will be resulted, bringing about a series of process problems, such as the size reduction of their adjacent Actives, the deformation during the photoetching for the Gate at later stages, etc.

SUMMARY OF THE INVENTION

The technical problem which this invention is aimed to resolve is to offer a dummy pattern filing method that can implement an intelligent filling of dummy patterns so that the DR of the filled dummy patterns can come infinitely close to the required DR value.

In order to resolve the above-mentioned technical problem, the method for filling dummy patterns as provided by this invention includes the following:

Step I: Providing the required DR value and isolation rules for patterns of the layouts on respective layers; by following said required DR value and isolation rules of patterns, determining the rule of filling dummy patterns, which ensures that the DR value of the patterns filled into the area in question satisfies said required DR value and isolation rules of patterns by changing the sizes, shapes and pitches of said dummy patterns.

Step II: Finding out Fields (empty areas) within said layout that need to be filled with dummy patterns.

Step III: By following said rule of filling dummy patterns, filling dummy patterns within said Fields on said layouts so that the DR for all the filled dummy patterns after filling comes close to the said required DR of patterns.

One further improvement is that the layers with which said layouts correspond include the Active, the Gate and the Metals.

One further improvement is that said Fields as mentioned in said Step II are located outside the main pattern of said layout.

One further improvement is that said required DR of patterns as mentioned in said Step I is a fixed solidified configuration and that for different layouts on the same layer, the same etching process is implemented after completing said Step II so that the etching process is solidified.

One further improvement is that for different layouts on the same layer, the difference between DRs of patterns for different layouts thereon after completing said Step III is less than 5%.

One further improvement is that Step IV that follows is implemented after completing said Step III: checking said DRs of patterns for said layouts.

Implementing the DR Check.

One further improvement is that said isolation rule for patterns as mentioned in said Step I is determined by relevant design rules; that said isolation rule for patterns includes the minimal pitch between a certain main pattern and its adjacent patterns; that the pitch between said dummy patterns and their corresponding main pattern is less than the minimal pitch corresponding with said main pattern as defined by said isolation rule for patterns.

One further improvement is that after said rule of filling dummy patterns is determined by Step I, the requirement of using EDA software to calculate the configuration of dummy patterns as needed is incorporated into said rule; that the sizes, shapes and pitches of said dummy patterns for different configurations vary from one another.

One further improvement is that the requirement of using the CAD software to find out Fields to be filled with dummy patterns is incorporated into said Step II.

In this invention, at first, the rule of filling dummy patterns is determined based on the required DR value and isolation rules of patterns; then the Fields needed to fill dummy patterns are found out; then by changing the sizes, shapes and pitches of said dummy patterns in accordance with said filling rule, said Fields are filled (with dummy patterns). By means of changing dummy patterns, this invention is able to automatically match dummy patterns with Fields, thereby completing intelligent filling of dummy patterns. As a result, the DR value for all the filled dummy patterns after completing filling comes infinitely close to the required DR value, thus acquiring stable DR values of patterns and eliminating large-sized areas prohibiting filling of dummy patterns. In comparison with the Fixed Dummy Pattern Filling, the method of this invention is a Smart Dummy Pattern Filling.

Owing to the stableness of the DR values of patterns arising from this invention, the same etching process can be adopted for all the pattern configurations reaching the same required DR values of patterns. Therefore, good CD values can be achieved without any modifications of etching menus, thus not only eliminating process delays and enhancing efficiency, but also reducing difficulties in managing menus of etching processes and preventing losses arising from wrong uses of etching menus.

Since this invention can eliminate large-sized areas prohibiting filling of dummy patterns, said dishing effect after flattening by means of said CMP process can also be eliminated, thus avoiding process problems arising therefrom, such as such as the size reduction of their adjacent Actives, the deformation during the photoetching for the Gate at later stages, etc.

BRIEF DESCRIPTION OF THE DRAWINGS

Further details (of this invention) are described as follows in connection with attached figures (and tables) and the Preferred Embodiment.

DETAILED DESCRIPTION

Figure 3:
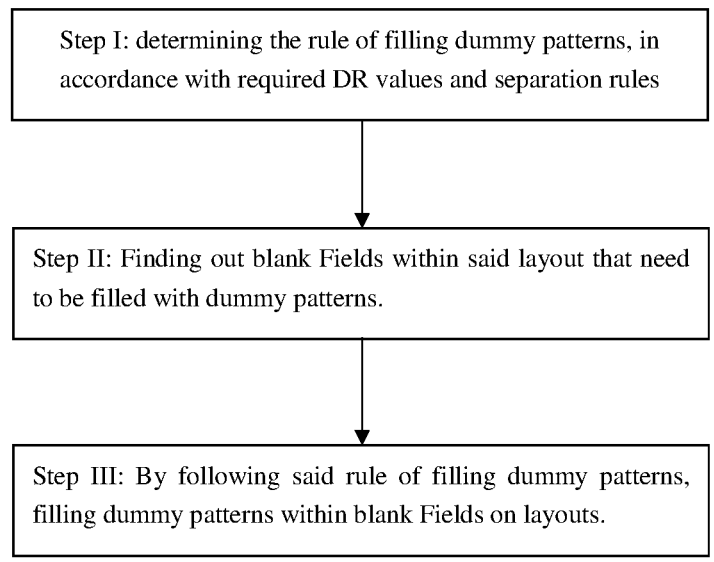
FIG. 3 is the flow diagram of the steps of filling dummy patterns for the Detailed Description of this invention.

FIG. 3 is the flow diagram of the steps of filling dummy patterns for the Preferred Embodiment of this invention. The method of filling dummy patterns for the Preferred Embodiment of this invention includes the following steps:

Step I: Providing the required DR value and isolation rules for patterns of the layouts on respective layers; by following said required DR value and said isolation rules of patterns, determining the rule of filling dummy patterns, which ensures that the DR value of the patterns filled into the area in question satisfies said required DR value and said isolation rules of patterns by changing the sizes, shapes and pitches of said dummy patterns.

The layers with which said layouts correspond include the Active, the Gate and the Metals (layers).

Said required DR value of patterns is a fixed configuration.

Said isolation rule for patterns is determined by relevant design rules; said isolation rule for patterns includes the minimal pitch between a certain main pattern and its adjacent patterns; the minimal pitch between said dummy patterns and their corresponding main pattern is less than the minimal pitch corresponding with said main pattern as defined by said isolation rule for patterns.

After said rule of filling dummy patterns is determined, the requirement of using EDA software to calculate the configuration of dummy patterns as needed is incorporated into said rule of filling; the sizes, shapes and pitches of said dummy patterns for different configurations vary from one another.

Step II: Finding out Fields within said layout that need to be filled with dummy patterns. Said Fields are located outside the main pattern of said layout.

It is better to use the CAD software to find out Fields within said layout, which are to be filled with dummy patterns.

Step III: By following said rule of filling dummy patterns, filling dummy patterns within said Fields on said layouts so that the DRs for all the filled dummy patterns after filling come close to the said required DR of patterns.

As said required DR value of patterns for the Preferred Embodiment of this invention is a fixed solidified configuration, the DRs of patterns for different layouts on the same layer after completing said Step III of filling dummy patterns are very similar to one another. It is better that for different layouts on the same layer, the difference between DRs of patterns for different layouts thereon after completing Step III is less than 5%. In this way, the same etching process is implemented after completing said Step III, thereby solidifying the etching process. Consequently, the adverse impacts arising from modifications of etching processes can be eliminated.

Step IV (that should also be included): Checking said DRs of patterns for said layouts; implementing the DRC check.

It can be seen from above that the Preferred Embodiment of this invention fills the dummy patterns of different shapes and sizes in accordance with the sizes of Fields (i.e., empty areas) as well as different ambient environments (of layouts). Therefore, in comparison with the Fixed Dummy Pattern Filling, the method of this invention is a Smart Dummy Pattern Filling. It is a Smart Dummy Pattern Filling and is able to come infinitely close the required DR value.

It is especially worth noting that while stably satisfying the required DR value of patterns and by means of changing the sizes and shapes of dummy patterns, the Preferred Embodiment of this invention is capable of filling dummy patterns for areas where the Fixed Dummy Pattern Filling finds it impossible to fill. To take a dummy active (as shown in Table 2) as an example, in order to reach a DR value of about 40% for filling dummy patterns, four different ways of filling may be used for different Fields, while keeping both the partial and global DRs as stable as 40%, approximately. While ensuring meeting said isolation rules and required DR values, dummy patterns can be flexibly generated to be filled in a way that satisfy relevant filling requirements.

Figure 1:
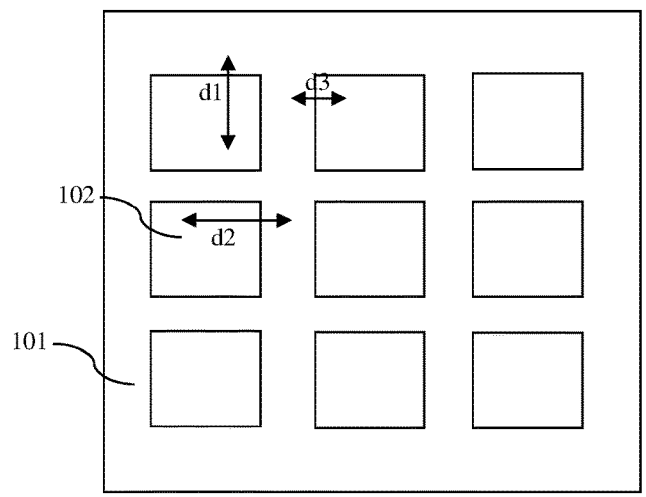
FIG. 1 illustrates how fixed dummy patterns are filled.
Figure 2:
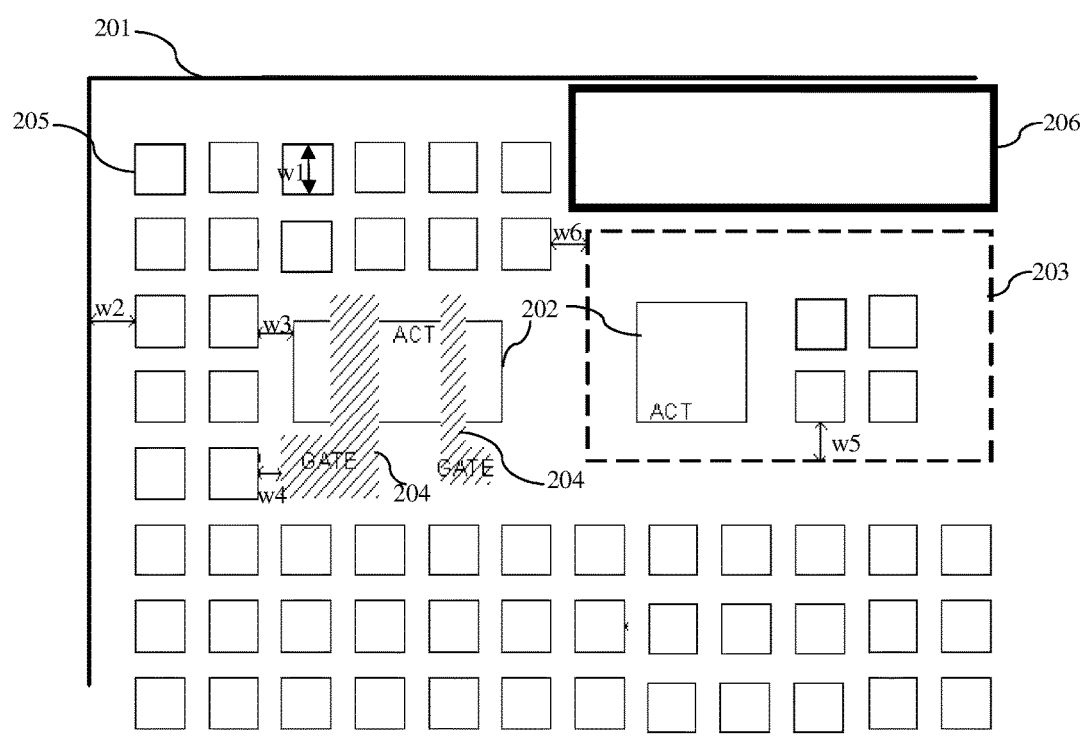
FIG. 2 illustrates the way fixed dummy patterns are filled under the restriction of isolation rules in accordance with the existing method.

Under the condition that the pitch between adjacent dummy patterns is 0.4 μm and that the pitch between the dummy pattern and the N-well is 0.6 μm, the length, breath and shape of the dummy pattern (205) as shown in FIG. 2 can be modified flexibly while ensuring a stable DR value of 40%.

TABLE 2

| Dummy Patterns | Breadth Length Ratio of Dummy Patterns (μm) | Pitches of Dummy Patterns (μm) | Pitches between Dummy Patterns and N-wells (μm) |
| --- | --- | --- | --- |
| 1 | 4.08 × 4.08 | 2.4 | 1.2 |
| 2 | 0.8 × 0.8 | 0.45 | 0.6 |
| 3 | 0.88 × 0.88 | 0.52 | 0.6 |
| 4 | 0.7 × 0.7 | 0.4 | 0.6 |

The invention is described above in a detailed way, however, it does not constitute a restriction on the invention. Based on the same principle of this invention, the technical people in this field may as many modifications and improvements as they like, which shall be deemed within the scope of protection of the invention.

What is claimed is:

1. A dummy pattern filling method for an integrated circuit layout, comprising the following steps:

Step I, providing a required Data Ratio (DR) value and an isolation rule for a pattern of a layout on a respective layer, said pattern used to etch said layer of an integrated circuit; determining a rule of filling a dummy pattern in accordance with said required DR value and said isolation rule of said pattern, which ensures that a DR value of said dummy pattern filled into a filling area satisfies said required DR value and said isolation rule by changing a size, a shape and a pitch of said dummy pattern;

Step II, finding out a blank Field within said layout that needs to be filled with a dummy pattern, wherein said blank Field in said Step II is located outside a main pattern of said layout; and Step III, by following said rule of filling a dummy pattern, filling by a processor a dummy pattern within said blank Field on said layout so that after said dummy pattern is filled said DR value of said dummy pattern approximates said required DR value, wherein for different layouts on the same layer, a difference between DRs of patterns for different layouts thereon after completing said Step III is less than 5%.

2. The dummy pattern filling method of claim 1, wherein said respective layer includes an active region, a control gate and a metal line.

3. The dummy pattern filling method of claim 1, wherein the required DR value in said Step I is a fixed solidified configuration; for different layouts on a same layer, a same etching process is implemented after completing said Step III so that the etching process is solidified.

4. The dummy pattern filling method of claim 1, further comprising a Step IV implemented after completing said Step III, said Step IV including:
   checking DRs of dummy patterns for said layouts; and
   implementing the DR check.

5. The dummy pattern filling method of claim 1, wherein said isolation rule for the dummy pattern in said Step I is determined by design rules;
   the isolation rule for dummy patterns includes a minimal pitch between a certain main pattern and its adjacent pattern; and
   the pitch between said dummy pattern and its corresponding main pattern is less than the minimal pitch corresponding with said main pattern as defined by said isolation rule for said dummy pattern.

6. The dummy pattern filling method of claim 1, further comprising after said isolation rule is determined by Step I, using EDA software to calculate a configuration of a dummy pattern; wherein the size, shape and pitch of said dummy pattern for different configurations vary from one another.

7. The dummy pattern filling method of claim 1, further comprising using CAD software to find out blank Fields to be filled with a dummy pattern in said Step II.

* * * * *